(12) United States Patent
Kim

(10) Patent No.: US 7,560,795 B2
(45) Date of Patent: Jul. 14, 2009

(54) SEMICONDUCTOR DEVICE WITH A CAPACITOR

(75) Inventor: Do Hun Kim, Chungcheongnam-do (KR)

(73) Assignee: Dongbu HiTek Co., Ltd., Seoul (KR)

(*) Notice: Subject to any disclaimer, the term of this patent is extended or adjusted under 35 U.S.C. 154(b) by 35 days.

(21) Appl. No.: 11/617,264

(22) Filed: Dec. 28, 2006

(65) Prior Publication Data
US 2007/0152258 A1 Jul. 5, 2007

(30) Foreign Application Priority Data
Dec. 29, 2005 (KR) .............. 10-2005-0133183

(51) Int. Cl.
*H01L 29/00* (2006.01)

(52) U.S. Cl. .............. 257/532; 257/303; 257/E21.579; 438/244

(58) Field of Classification Search .............. 257/213, 257/288, 296, 301, 303, 304, 305, 499, 528, 257/532, 535, E21.579; 438/142, 197, 238, 438/239, 243, 244

See application file for complete search history.

(56) References Cited

U.S. PATENT DOCUMENTS

2004/0056324 A1* 3/2004 Ning et al. .............. 257/528

FOREIGN PATENT DOCUMENTS

KR    10-2004-0071816 A   *   8/2004

\* cited by examiner

*Primary Examiner*—Evan Pert
*Assistant Examiner*—Kevin Quinto
(74) *Attorney, Agent, or Firm*—Sherr & Vaughn, PLLC

(57) ABSTRACT

Embodiments relate to a semiconductor having a capacitor and a method of fabricating the same, that may be capable of simplifying a manufacturing process and increasing a capacitance of a capacitor. In embodiments, a method of forming a capacitor may use a dual damascene process and may be simplified by simultaneously forming a contact plug for applying a bias voltage to a bottom electrode and a capacitor.

14 Claims, 12 Drawing Sheets

SEMICONDUCTOR DEVICE WITH A CAPACITOR

The present application claims priority under 35 U.S.C. 119 and 35 U.S.C. 365 to Korean Patent Application No. 10-2005-0 133183 (filed on Dec. 29, 2005), which is hereby incorporated by reference in its entirety.

BACKGROUND

A Merged Memory Logic (MML) device may be a device including a Dynamic Random Access Memory (DRAM) and peripheral circuits integrated on a single chip.

MML has improved the functionality of multimedia and may allow high-integration and high-speed operation of a semiconductor device to be more effectively achieved. In addition, in the field of an analog circuit requiring high-speed operation, a semiconductor device having a mass storage capacitor is being developed.

A capacitor may have a Polysilicon-Insulator-Polysilicon (PIP) structure. In such a situation, a top electrode and a bottom electrode may include conductive polysilicon.

However, a capacitor having such a PIP structure may have various disadvantages. For example, a capacitance may be lowered because natural oxide layers may be formed due to an oxidation reaction occurring at the interfacial surface between the top/bottom electrodes and a dielectric thin film.

Further, due to a depletion region that may be formed in a polysilicon layer, a PIP capacitor may have a lowered capacitance and thus may be unsuitable for high-speed and/or high-frequency operation.

A MIM type capacitor, on the other hand, may be used for high performance semiconductor devices. It may have low resistivity and may not cause parasitic capacitance derived from the depletion.

FIGS. 1A and 1B are example cross-sectional diagrams to illustrate a related art semiconductor and method for fabricating a semiconductor device having an MIM capacitor and a damascene interconnection structure.

Referring to FIG. 1A, first metallic interconnection 15 and second metallic interconnection 20 may be formed on bottom insulating layer 10 of semiconductor substrate 1. First and second metallic interconnections 15 and 20 may not form a step difference relative to bottom insulating layer 10.

A metallic layer may be formed on a resultant structure where first metallic interconnection 15 and second metallic interconnection 20 are formed. The metallic layer may be patterned, and may form bottom electrode 25 of a capacitor making contact with a top surface of second metallic interconnection 20.

Dielectric layer 30 may be formed on a resultant structure including bottom electrode 25. Another metallic layer may then be formed on dielectric layer 30, and may be patterned such that top electrode 35 of the capacitor is formed, for example at a position corresponding to bottom electrode 25. Interlayer dielectric layer 40 may be formed on a resultant structure where top electrode 35 may be formed.

Referring to FIG. 1B, a top surface of interlayer dielectric layer 40 may be planarized, for example by a CMP process. Then, interlayer dielectric layer 40 and dielectric layer 30 may be etched, for example to form via hole V1 that may expose a top surface of first metallic interconnection 15.

First trench T1 may be formed on a top of via hole V1. Second trench T2, that may expose a top surface of top electrode 35, may be formed. Via hole V1 and first and second trenches T1 and T2 may be filled with Cu. A CMP process may then be performed with respect to Cu, and may thereby form a damascene interconnection structure 45 and contact plug 50.

The above described technique may have various problems. For example, a metallic interconnection process for applying a bias voltage to a bottom electrode of the capacitor may be necessary, and a process may become more complex because the via hole and the trench of the top electrode may not be able to be simultaneously formed.

In addition, capacitors may increasingly be important components in a structure of a logic device. Hence, there may be a technical need to improve a capacitance of a capacitor.

There may be several methods for maintaining and/or increasing a capacitance of a capacitor at an appropriate value in a limited unit area, as expressed by the equation $C=\varepsilon As/d$ ($\varepsilon$: dielectric constant, As: surface area of electrode, d: thickness of dielectric element). Some of the suggested methods include reducing a thickness of a dielectric element, increasing a surface area of a electrode, and using a material having a high dielectric constant $\varepsilon$.

With respect to increasing a surface area of an electrode, a related art analog capacitor may use a metallic interconnection as top and bottom electrodes. Accordingly the effective surface area of the related art analog capacitor may be formed as a plane. Hence, there may be a limitation regarding increasing a surface area of the electrode.

FIGS. 2A to 2E are example cross-sectional diagrams to illustrate a related art method for fabricating a semiconductor device having a capacitor and a contact plug between interlayer interconnections.

Referring to FIG. 2A, interlayer dielectric layer 2 may be formed. Metallic conductive layer may be formed and patterned on a top of interlayer dielectric layer 2 such that bottom electrode 4A and bottom interconnection 4B may be formed. A semiconductor substrate (not shown), on which the semiconductor device may be formed, may exist under interlayer dielectric layer 2.

Inter-metallic dielectric layer 6 may be formed and planarized on bottom electrode 4A and bottom interconnection 4B.

Referring to FIG. 2B, contact hole 8 that may expose bottom electrode 4A of the capacitor may be formed by using a known photolithographic process.

Contact hole 8, that may expose bottom electrode 4A, may constitute an effective surface area of the capacitor, so the capacitor may have a large effective surface area.

Referring to FIG. 2C, dielectric layer 10 may be formed on a surface of the substrate including contact hole 8.

Referring to FIG. 2D, via hole 12, that may expose bottom interconnection 4B, may be formed, for example using a known photolithographic process.

Referring to FIG. 2E, a top interconnection conductive layer may be formed and patterned on a surface of semiconductor substrate, and a form top electrode 14A and top interconnection 14B of the capacitor.

The MIM capacitor as described above may be limited as to an increase in capacitance of the capacitor because the effective surface area of the capacitor is formed as a plane.

SUMMARY

Embodiments relate to a semiconductor device having a capacitor, and a method of fabricating a semiconductor device having a capacitor. Embodiments relate to a semiconductor device having a capacitor and a method of fabricating the same, that may be capable of simplifying the manufacturing process and increasing a capacitance of the capacitor.

Embodiments relate to a capacitor that can be simultaneously formed with a contact plug for applying a bias voltage to a bottom electrode through a capacitor fabricating process using a dual damascene process.

Embodiments relate to a capacitor and a method of fabricating a capacitor that may be capable of simplifying a manufacturing process and increasing a capacitance of a capacitor by coupling capacitors in a row.

In embodiments, a semiconductor device having capacitors may include a substrate having a capacitor region and a contact plug region, a first conductor formed on the substrate, at least one first insulating layer formed on an entire surface of the substrate including the first conductor, a first contact hole extending by passing through the first insulating layer to expose a first conductive part of the capacitor region, a second contact hole extending by passing through the first insulating layer to expose a first conductive part of the contact plug region, a second conductor formed in the first contact hole and the second contact hole, a first capacitor insulating layer formed on the second conductor aligned in the first contact hole, a third conductor formed in the first contact hole, such that the third conductor is placed on the capacitor insulating layer, and having a trench on a top thereof, a second capacitor insulating layer formed in the trench, a fourth conductor formed in the trench, such that the fourth conductor is placed on the second capacitor insulating layer, and having a trench on a top thereof, a contact plug formed on the second conductor aligned in the second contact hole, at least one second insulating layer formed on an entire surface of the substrate including the contact plug and the fourth conductor, a third contact hole extending by passing through the second insulating layer to expose the third conductor, a fourth contact hole extending by passing through the second insulating layer to expose the fourth conductor and the contact plug, a first interconnection layer formed in the third contact hole, and a second interconnection layer formed in the fourth contact hole.

First to third contact holes may be formed as via holes or trenches. The fourth contact hole may include a first via hole that may expose the fourth conductor, a second via hole for exposing the contact plug, and a trench formed on tops of the first and second via holes to overlap the first and second via holes.

The semiconductor device may also include a third insulating layer having a fifth contact hole where the first conductor is formed.

In embodiments, a method of fabricating a semiconductor device having capacitors may include preparing a substrate having a capacitor region and a contact plug region, forming a first insulating layer having a first contact hole on an entire surface of the surface, forming a first conductor in the first contact hole, forming at least one second insulating layer on an entire surface of the substrate including the first insulating layer and the first conductor, forming a second contact hole extending by passing through the second insulating layer to expose a first conductive part of the capacitor region, and a third contact hole extending by passing through the second insulating layer to expose a first conductive part of the contact plug region, forming a second conductor in each of the second contact hole and the third contact hole, forming a first capacitor insulating layer in the second contact hole such that the first capacitor insulating layer is placed on the second conductor, forming a third conductor in the second contact hole such that the third conductor is placed on the first capacitor insulating layer, and forming a contact plug in the third contact hole such that the contact plug is placed on the second conductor, forming the third conductor in the second contact hole such that the third conductor is placed on the first capacitor insulating layer, forming a trench by removing a portion of the third conductor, forming a second capacitor insulating layer in the trench, forming a fourth conductor in the trench such that the fourth conductor is placed on the second capacitor insulating layer, forming at least one third insulating layer on an entire surface of the substrate including the contact plug and the fourth conductor, forming a fourth contact hole extending by passing through the third insulating layer to expose the third conductor, and forming a fifth contact hole extending by passing through the third insulating layer to expose the fourth conductor and the contact plug, and forming a first interconnection layer in the third contact hole, and forming a second interconnection layer in the fourth contact hole.

The second to fourth contact holes may be formed as via holes or trenches. The fifth contact hole may include a first via hole for exposing the fourth conductor, a second via hole for exposing the contact plug, and a trench formed on tops of the first and second via holes to overlap the first and second via holes.

DETAILED DESCRIPTION OF EMBODIMENTS

Figure 1A:
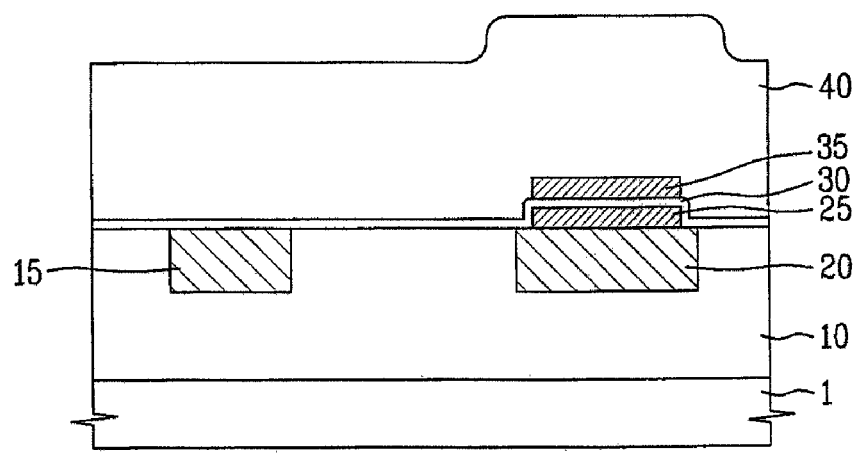
FIGS. 1A to 2E are example cross-sectional diagrams illustrating a related art semiconductor and method for fabricating a MIM capacitor of a dual damascene structure.
Figure 1B:
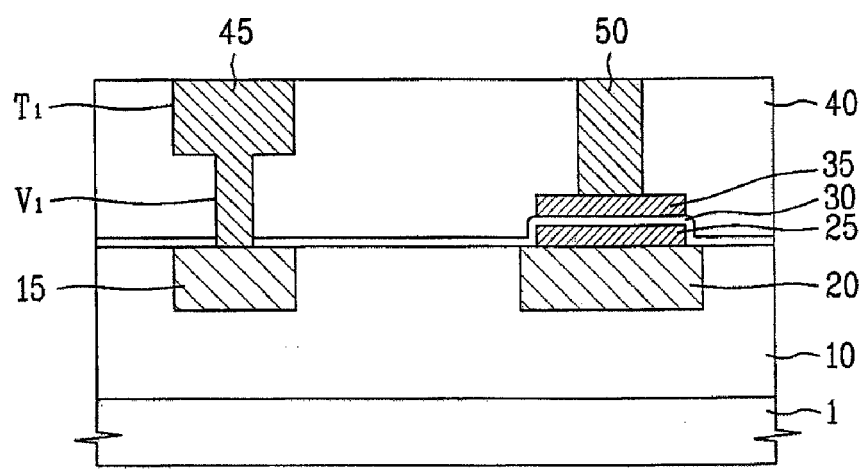
Figure 2A:
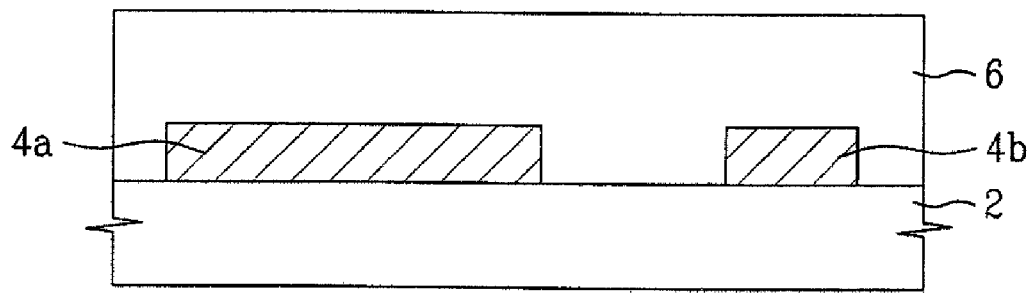
Figure 2B:
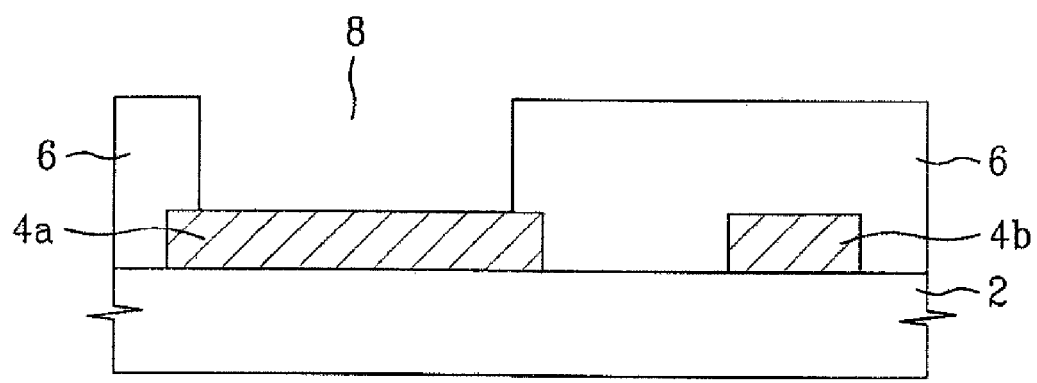
Figure 2C:
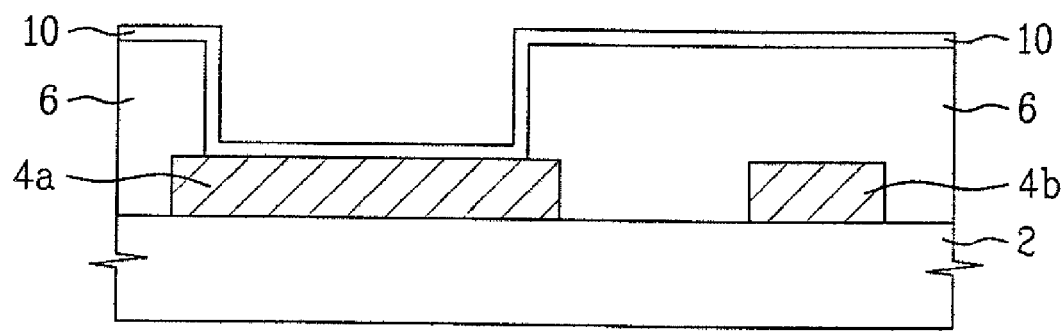
Figure 2D:
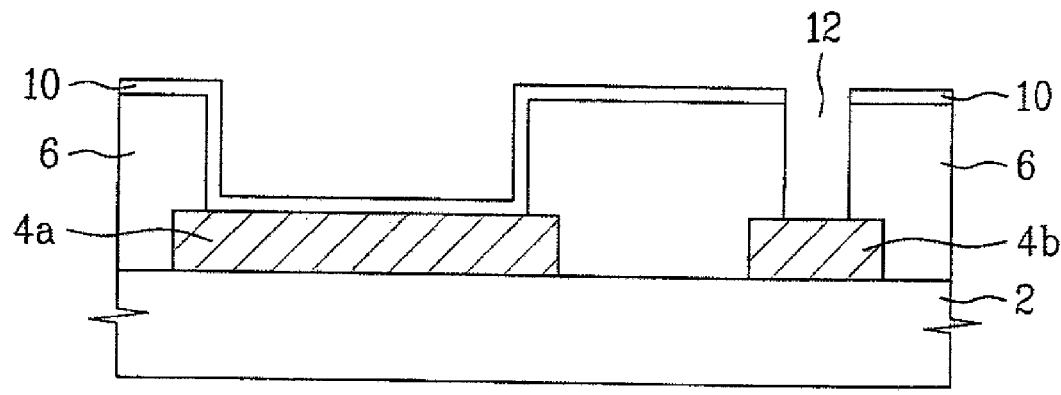
Figure 2E:
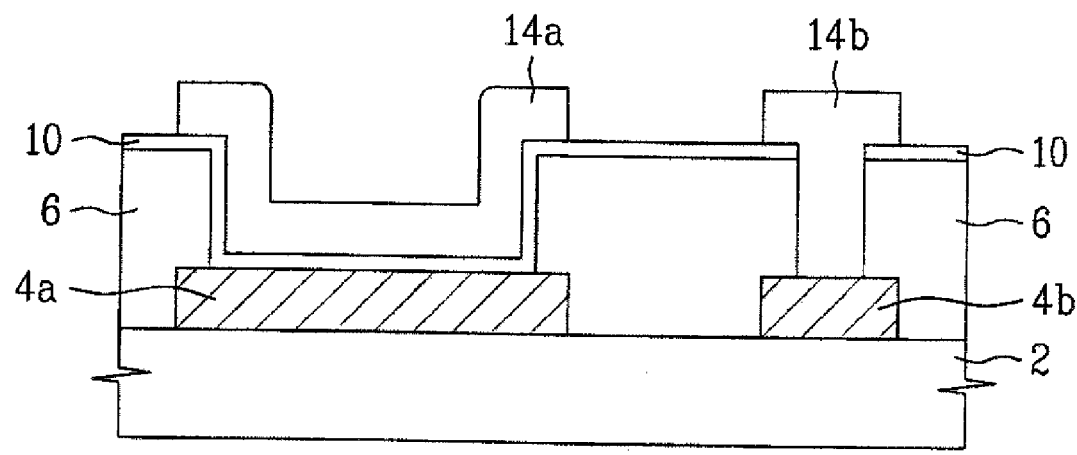
Figure 3A:
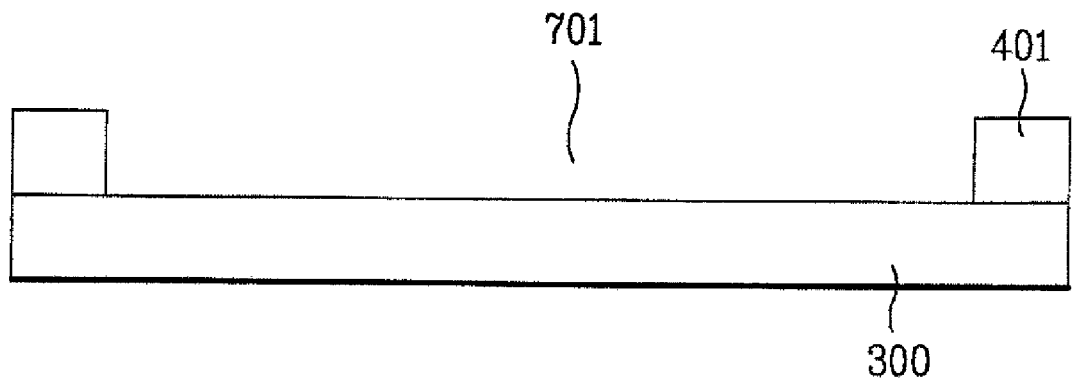
FIGS. 3A to 3P are example diagrams illustrating a semiconductor and method of fabricating a semiconductor having capacitors according to embodiments.

Referring to FIG. 3A, substrate 300 may have a contact plug region and a capacitor region. First insulating layer 401 may be formed on a surface of substrate 300.

First insulating layer 401 may be patterned, for example, through a photo and etching process such that trench 701 may be formed in first insulating layer 401.

Figure 3B:
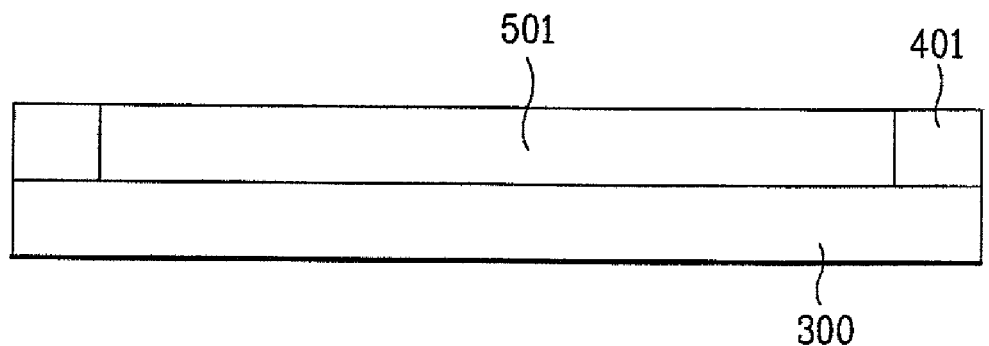

Referring to FIG. 3B, first conductor 501 may be formed on a surface of substrate 300 including trench 701. First conductor 501 may be planarized, for example, through a Chemical Mechanical Polishing (CMP) process. Accordingly, first conductor 501 may be buried in trench 701 formed in first insulating layer 401.

Figure 3C:
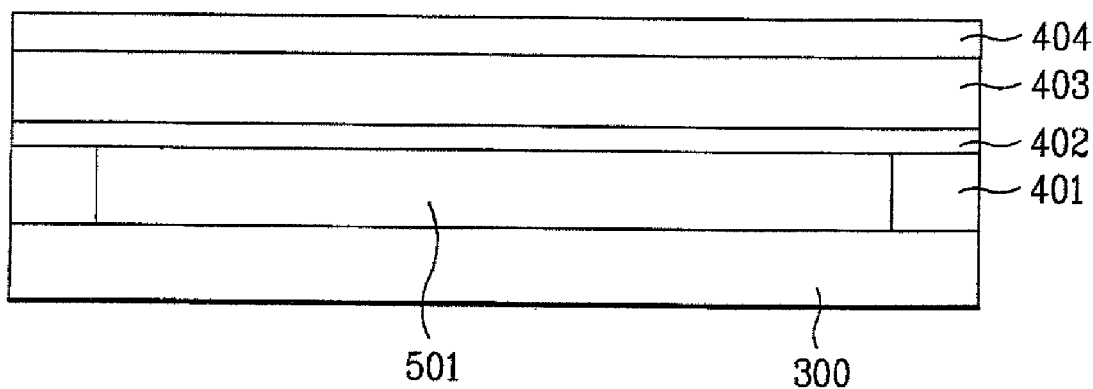

Referring to FIG. 3C, second insulating layer 402, third insulating layer 403, and fourth insulating layer 404 may be sequentially laminated on a surface of substrate 300 including first conductor 501 and first insulating layer 401.

Figure 3D:
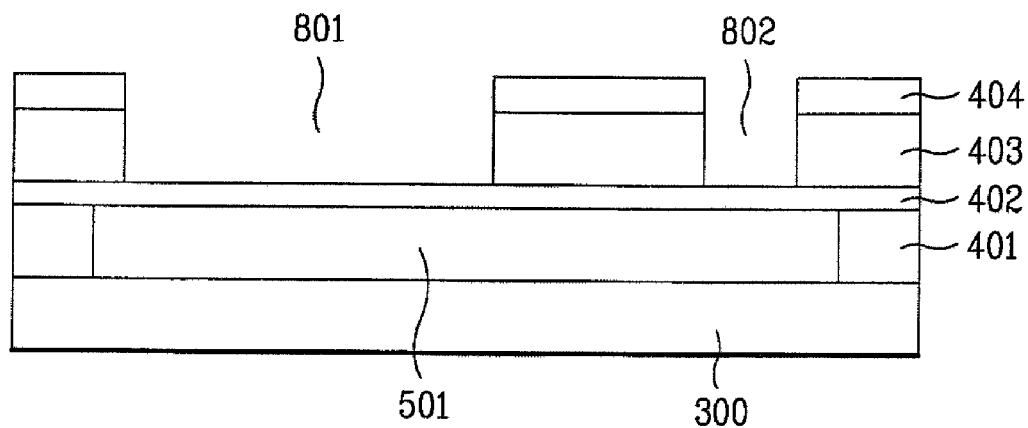

Referring to FIG. 3D, fourth insulating layer 404 and third insulating layer 403 may be patterned, for example, through a photo and etching process, such that first via hole 801 may be formed in the capacitor region and second via hole 802 may be formed in the contact plug region.

Figure 3E:
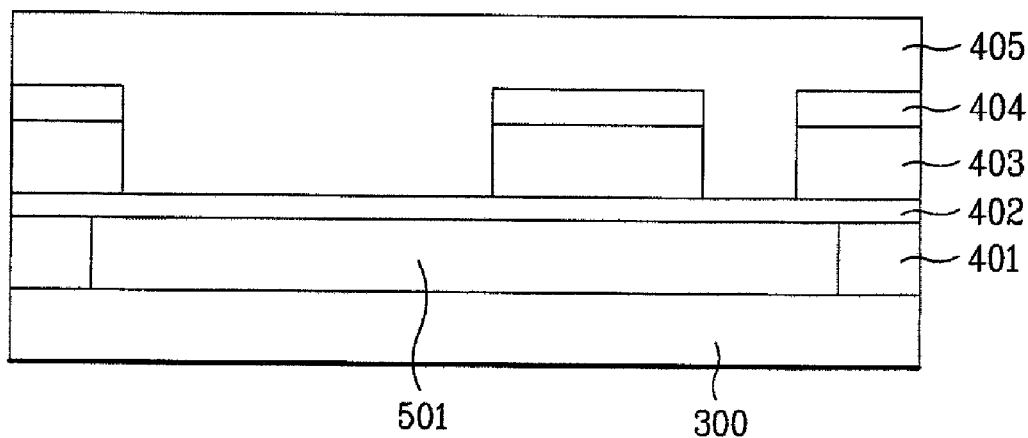
Figure 3F:
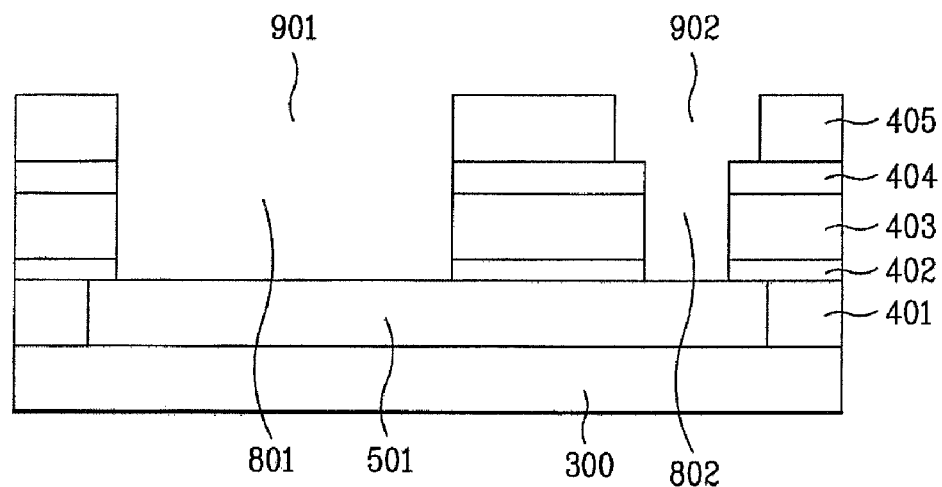

Referring to FIGS. 3E and 3F, fifth insulating layer 405 may be formed on a surface of substrate 300 where first and second via holes 801 and 802 may be formed. Fifth and second insulating layers 405 and 402 may be patterned, for example, through a photo and etching process, such that first trench 901 may be formed in the capacitor region and second trench 902 may be formed in the contact plug region.

First via hole 801 may pass through second insulating layer 402, which may be placed in the capacitor region, and may expose a portion of conductor 501.

Second via hole 802 may pass through second insulating layer 402, which may be placed in the contact plug region, and may expose a portion of conductor 501.

First trench 901 may be coupled to first via hole 801 of the capacitor region. Accordingly, a width of first trench 901 may be identical to that of first via hole 801. A depth of first via hole 801 may be as deep as first trench 901, according to embodiments.

In other words, a contact hole of a single damascene structure that may expose a portion of first conductor 501 may be formed in the capacitor region.

Second trench 902 may be coupled with second via hole 802 of the contact plug region. A width of second trench 902 may be wider than that of second via hole 802. That is, a contact hole of a dual damascene structure that exposes a portion of first conductor 501 may be formed in the contact plug region.

Figure 3G:
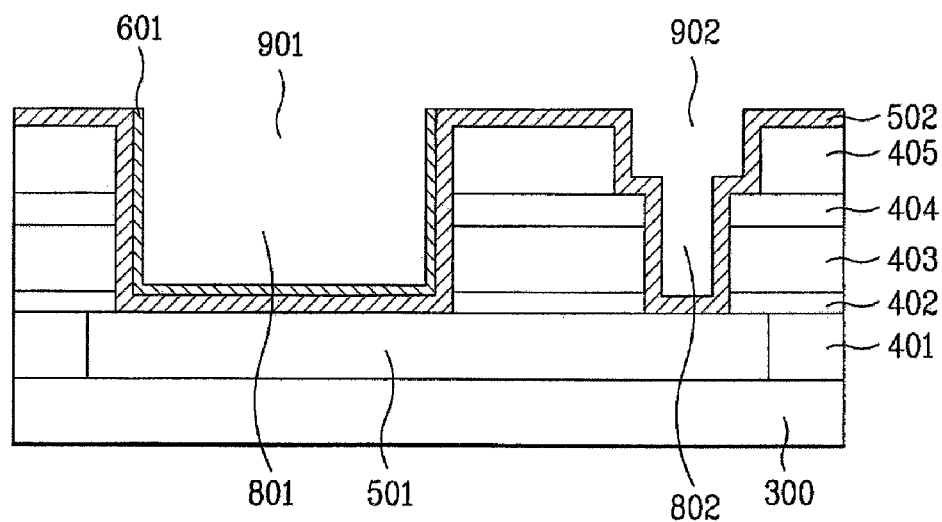

Referring to FIG. 3G, second conductor 502 may be laminated on a surface, for example where first and second trenches 901 and 902 and first and second via holes 801 and 802 may be formed. First capacitor insulating layer 601 may be laminated and/or formed on second conductor 502 within the first trench 901.

Figure 3H:
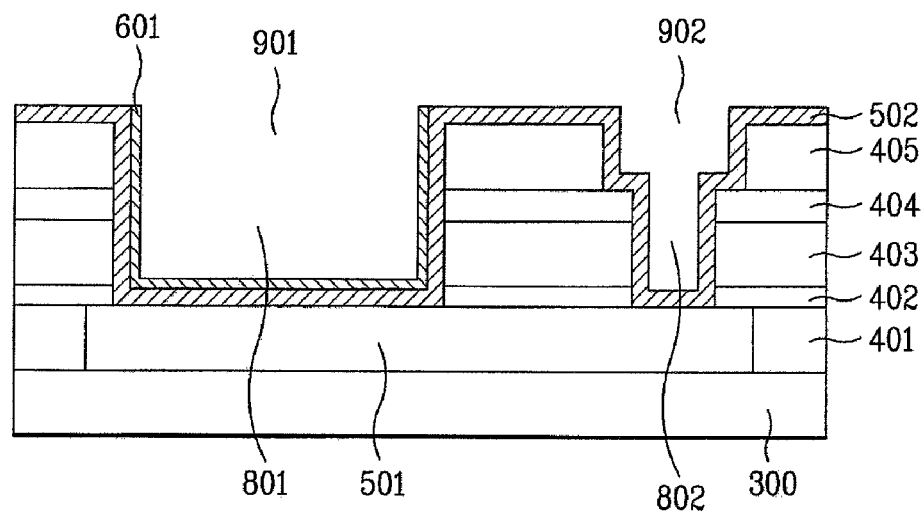

Referring to FIG. 3H, first capacitor insulating layer 601 may be patterned, for example, through a photo and etching process, such that first capacitor insulating layer 601 may be formed only along inner walls of first trench 901 and first via hole 801.

That is, first capacitor insulating layer 601 may be formed only in the capacitor region and not formed in the contact plug region.

Figure 3I:
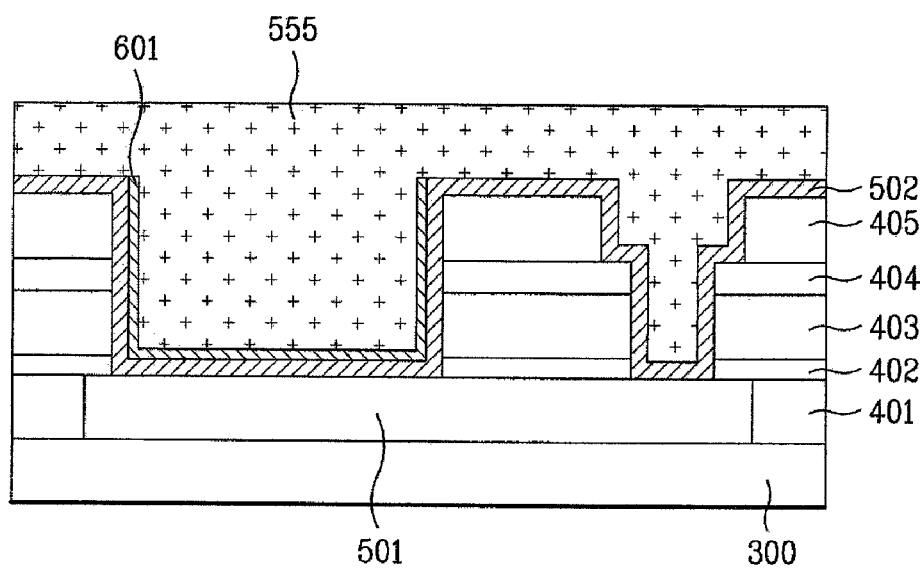

Referring to FIG. 3I, metallic layer 555 may be formed on a surface of substrate 300, including first capacitor insulating layer 601 and second conductor 502.

Figure 3J:
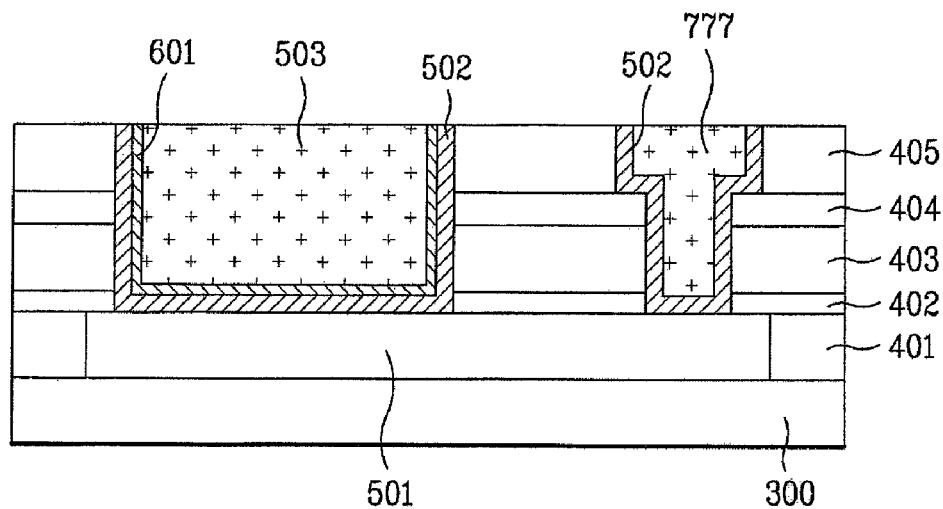

Referring to FIG. 3J, metallic layer 555, second conductor 502, and first capacitor insulating layer 601 may be polished through a CMP process, until a surface of fifth insulating layer 405 appears.

Third conductor 503, which may be buried in first via hole 801 and first trench 901, may thus be formed in the capacitor region. Contact plug 777, which may be buried in second via hole 802 and second trench 902, may thus be formed in the contact plug region.

Figure 3K:
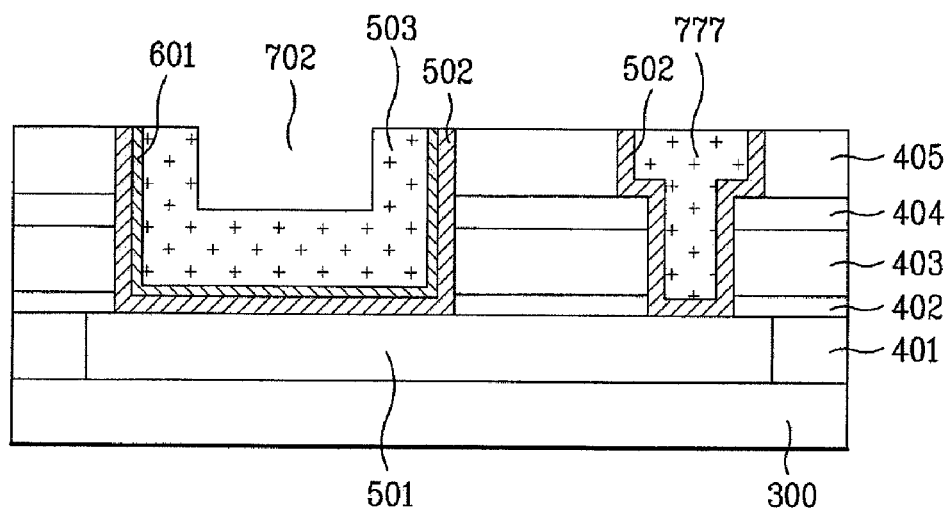

Referring to FIG. 3K, a portion of third conductor 503 may be removed and trench 702 may thus be formed.

Figure 3L:
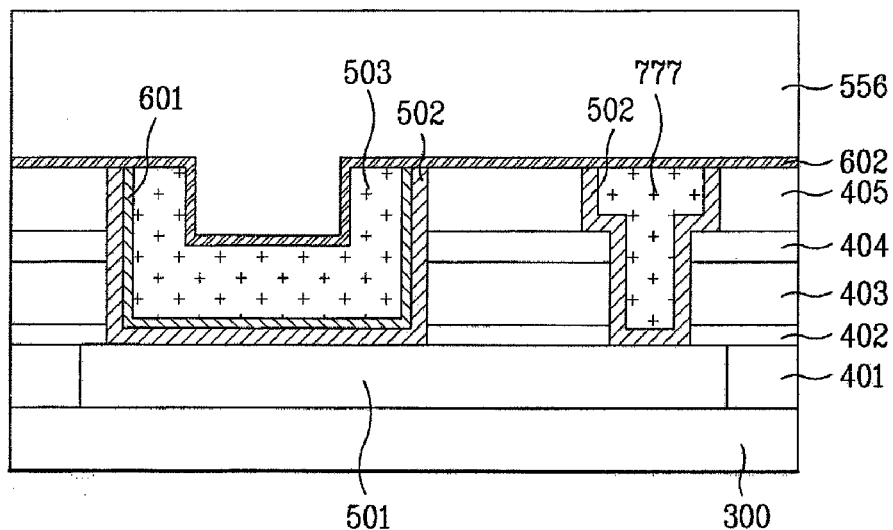

Referring to FIG. 3L, second capacitor insulating layer 602 and metallic layer 556 may be sequentially deposited on a surface of substrate 300 including trench 702 and second capacitor insulating layer 602.

Figure 3M:
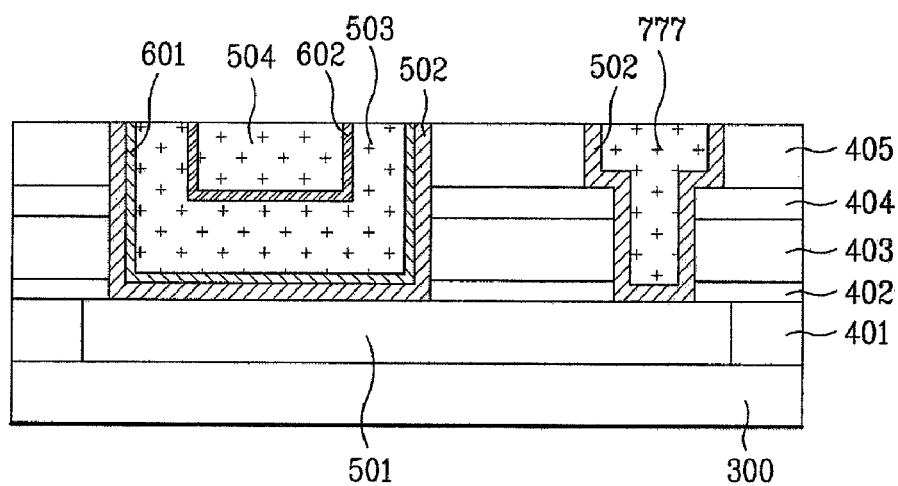

Referring to FIG. 3M, metallic layer 556 and second capacitor insulating layer 602 may be polished through a CMP process, until a surface of fifth insulating layer 405 appears. Second capacitor insulating layer 602 and fourth conductor 504, which may be buried in trench 702, may be formed in the capacitor region.

Figure 3N:
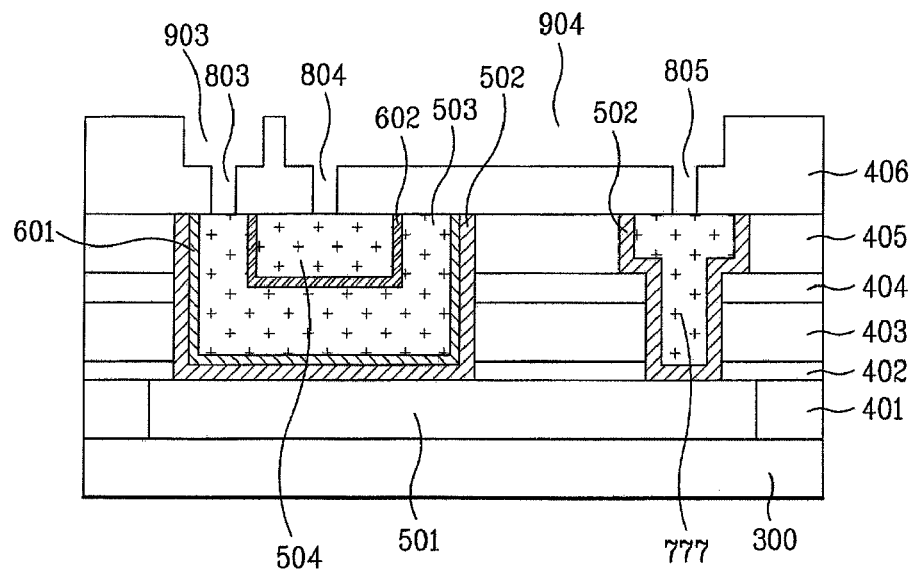

Referring to FIG. 3N, sixth insulating layer 406 may be formed on a surface of substrate 300 including second capacitor insulating layer 602 and fourth conductor 504. Sixth insulating layer 406 may be patterned, for example, through a photo and etching process such that third via hole 803 and third trench 903, that may expose a portion of third conductor 503 may be formed. Fourth via hole 804 and fourth trench 904, which may expose a portion of fourth conductor 504, and fifth via hole 805, which may expose a portion of contact plug 777, may be formed. Fourth trench 904 may be commonly coupled to fourth via hole 804 and fifth via hole 805. That is, fourth trench 904 may be formed on tops of fourth and fifth via holes 804 and 805, and may overlap both of fourth and fifth via holes 804 and 805.

Figure 3O:
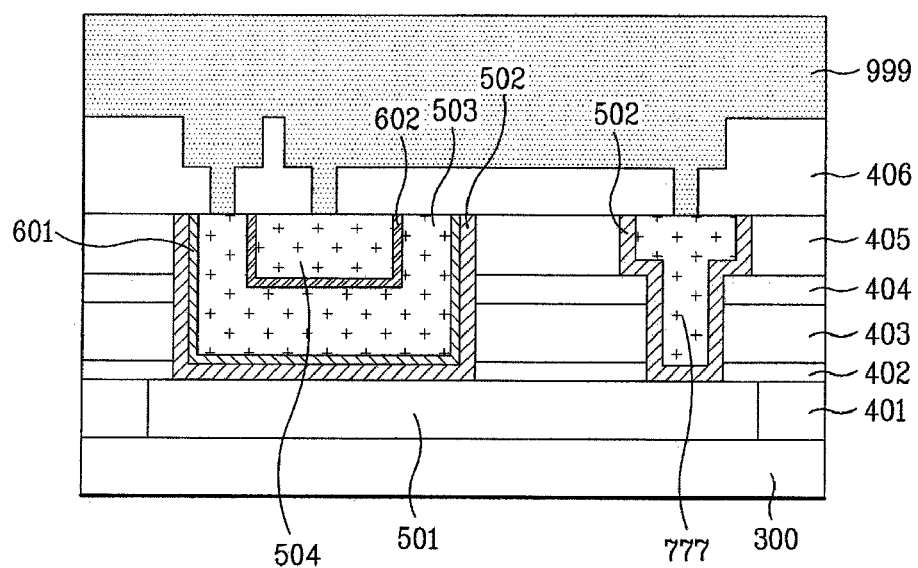

Referring to FIG. 3O, metallic layer 999 may be formed on a surface of substrate 300 including third via hole 803, fourth via hole 804, fifth via hole 805, third trench 903 and fourth trench 904.

Figure 3P:
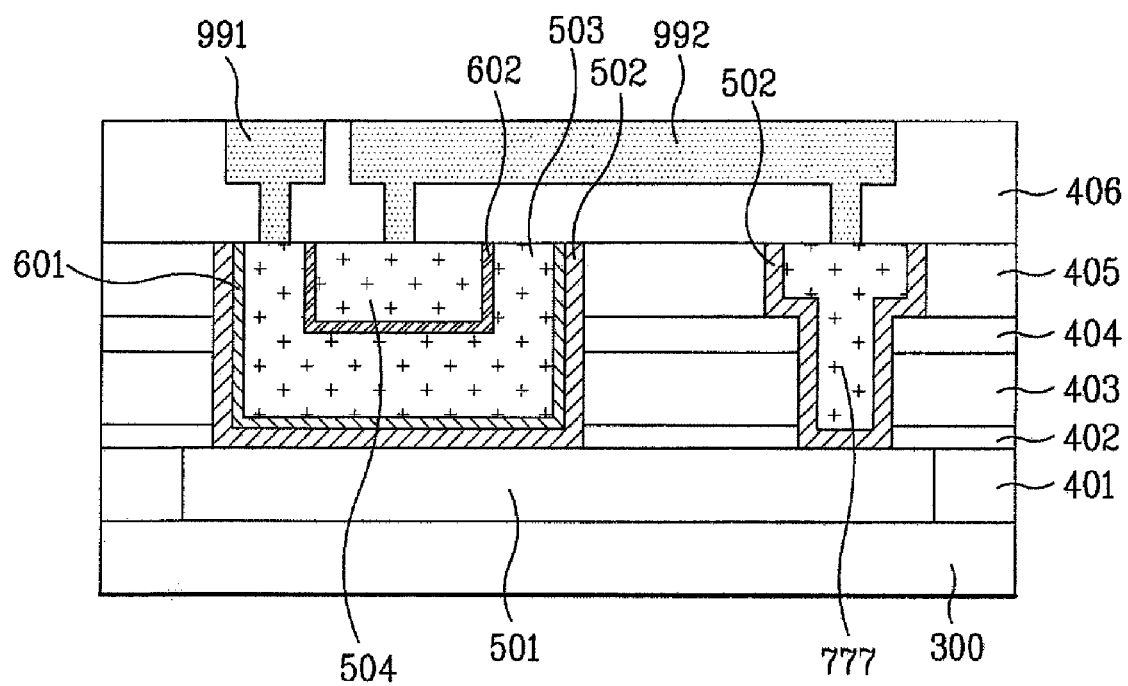

Referring to FIG. 3P, metallic layer 999 may be polished, for example through a CMP process, until a surface of sixth insulating layer 406 appears.

First and second interconnection layers 991 and 992 may be formed through the above described processes.

First interconnection layer 991 may be electrically coupled with third conductor 503, and second interconnection layer 992 may be electrically coupled with fourth conductor 504 and contact plug 777.

Accordingly, two capacitors connected in parallel to each other may be formed in the capacitor region.

That is, a first capacitor including second conductor 502, third conductor 503 and first capacitor insulating layer 601, and a second capacitor including third conductor 503, fourth conductor 504 and second capacitor insulating layer 602 may be provided.

Second conductor 502 of the first capacitor may be electrically coupled to fourth conductor 504 of the second capacitor through first conductor 501, second conductor 502 (second conductor 502 of the contact plug region), contact plug 777, and the second interconnection layer 992. Therefore, the first capacitor and the second capacitor may be connected in parallel to each other.

According to embodiments, each of the dielectric layers (first to sixth insulating layers 401 to 406), and first and second capacitor insulating layers 601 and 602 may be formed by using a nitride layer, a SiC aluminum oxide, or a silicon oxide.

First, second, third, and fourth conductors 501, 502, 503, and 504 may be formed of a TaN or a multilayer having a TaN, a TiN or a multilayer having a TiN, and a WN or a multilayer including a WN. Further, the capacitor dielectric layer may act as a capacitor interlayer insulating layer, and may be formed of any one of a Nitride layer, a TEOS, a Tantalum based oxide, and an Aluminum based oxide.

According to embodiments, a semiconductor device may have capacitors, which may be connected in a row. Capacitance of the capacitor may thus be improved.

That is, the capacitors provided in the semiconductor device according to embodiments may have mass storage capacitance, for example as compared to a related art capacitor.

Further, according to embodiments contact plug 777 and the capacitors may be fabricated through the same process. Accordingly, a fabrication process may be simplified.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A device comprising:
   a first conductor formed over a substrate having a capacitor region and a contact plug region;
   at least one first insulating layer formed over an entire surface of the substrate including the first conductor;
   a first contact hole extending through the first insulating layer to expose a first portion of the first conductor over only the capacitor region;

a second contact hole extending through the first insulating layer to expose a second portion of the first conductor over only the contact plug region;
a second conductor formed in the first contact hole and the second contact hole;
a first capacitor insulating layer formed in the first contact hole over the second conductor;
a third conductor formed in the first contact hole over the capacitor insulating layer, and having a trench therein;
a second capacitor insulating layer formed in the trench;
a fourth conductor formed in the trench over the second capacitor insulating layer; and
a contact plug formed over the second conductor in the second contact hole,
wherein the fourth conductor and the contact plug are electrically coupled to each other.

2. The device of claim 1, wherein the second and third conductor and first capacitor insulator form a first capacitor, and wherein the third and fourth conductor and second capacitor insulating layer form a second capacitor, and wherein the first a and second capacitors are connected in parallel to each other.

3. The device of claim 1, wherein the first and second contact holes comprise at least one of a via hole and a trench.

4. The device of claim 1, further comprising:
at least one second insulating layer formed over the entire surface of the substrate including the contact plug and the fourth conductor;
a third contact hole extending through the second insulating layer to expose the third conductor;
a fourth contact hole extending through the second insulating layer to expose the fourth conductor and the contact plug;
a first interconnection layer formed in the third contact hole; and
a second interconnection layer formed in the fourth contact hole.

5. The device of claim 4, wherein the third contact hole comprises at least one of a via hole and a trench.

6. The device of claim 4, wherein the fourth contact hole comprises:
a first via hole configured to expose the fourth conductor;
a second via hole configured to expose the contact plug; and
a trench formed over the first and second via holes configured to overlap the first and second via holes.

7. The device of claim 4, further comprising a third insulating layer having a fifth contact hole where the first conductor is formed.

8. A method comprising:
forming first and second capacitors over a first conductor over a semiconductor substrate having a capacitor region and a contact plug region, the first and second capacitors being connected in parallel, wherein forming the first and second capacitors comprises:
forming a first insulating layer having a first contact hole on an entire surface of the semiconductor substrate;
forming a first conductor in the first contact hole;
forming a second insulating layer over the entire surface of the substrate including the first insulating layer and the first conductor;
forming a second contact hole extending through the second insulating layer to expose a first portion of the first conductor over only the capacitor region;
forming a third contact hole extending through the second insulating layer to expose a second portion of the first conductor over only the contact plug region;
forming a second conductor in each of the second contact hole and the third contact hole;
forming a first capacitor insulating layer in the second contact hole over the second conductor;
forming a third conductor in the second contact hole over the first capacitor insulating layer;
forming a contact plug in the third contact hole over the second conductor;
forming a trench by removing a portion of the third conductor;
forming a second capacitor insulating layer in the trench; and
forming a fourth conductor in the trench over the second capacitor insulating layer,
wherein the first capacitor comprises the second conductor, the first capacitor insulating layer and the third conductor, the second capacitor comprises the third conductor, the second capacitor insulating layer and the fourth conductor, and the second conductor is electrically coupled to the fourth conductor by the first conductor, the contact plug, and an interconnection layer coupling the contact plug to the fourth conductor.

9. The method of claim 8, further comprising:
forming at least one third insulating layer over the entire surface of the semiconductor substrate including the contact plug and the fourth conductor;
forming a fourth contact hole extending through the third insulating layer to expose the third conductor, and forming a fifth contact hole extending through the third insulating layer to expose the fourth conductor and the contact plug; and
forming the interconnection layer in the fourth contact hole, and forming a second interconnection layer in the fifth contact hole.

10. The method of claim 9, wherein the second, third, and fourth contact holes comprise at least one of via holes and trenches.

11. The method of claim 9, wherein forming the fifth contact hole comprises:
forming a first via hole configured to expose the fourth conductor; and
forming a second via hole configured to expose the contact plug.

12. The method of claim 11, further comprising forming a trench on the first and second via holes configured to overlap with the first and second via holes.

13. A device comprising:
a substrate having a capacitor region and a contact plug region;
a first conductor formed over the substrate, including the capacitor region and the contact plug region;
an insulating layer formed over the substrate including the first conductor;
a first contact hole formed in the capacitor region extending through the insulating layer and exposing a first portion of the first conductor;
a second contact hole formed in the contact plug region extending through the insulating layer and exposing a second portion of the first conductor;
a second conductor formed in the first contact hole and the second contact hole;
a first capacitor insulating layer formed in the first contact hole and over the second conductor;
a third conductor formed in the first contact hole and over the first capacitor insulating layer;
a trench formed in the third conductor;
a contact plug formed in the second contact hole and over the second conductor;

a second capacitor insulating layer formed over sidewalls of the trench;
a fourth conductor formed in the trench and over the second capacitor insulating layer;
a first interconnection layer electrically coupled with the third conductor; and
a second interconnection layer electrically coupled with the fourth conductor and the contact plug.

14. The device of claim 13, wherein the second and third conductor and the first capacitor insulating layer form a first capacitor, and the third and fourth conductor and the second capacitor insulating layer form a second capacitor, and wherein the first and second capacitors are connected in parallel to each other.

* * * * *